May 17, 1960 L. J. KROKO 2,937,324
SILICON CARBIDE RECTIFIER
Filed Feb. 5, 1959
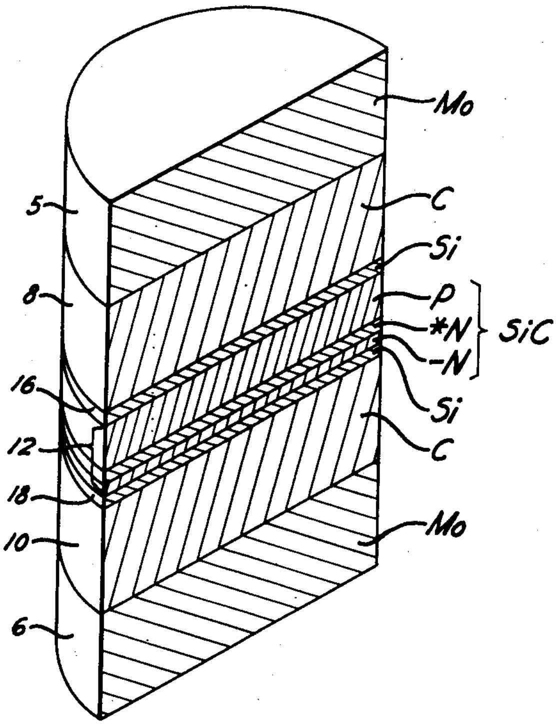
INVENTOR.
LEONARD J. KROKO
BY
Frederick Shapoe
ATTORNEY United States Patent Office 2,937,324
Patented May 17, 1960

2,937,324

SILICON CARBIDE RECTIFIER

Leonard J. Kroko, Pitcairn, Pa., assignor to Westinghouse Electric Corporation, East Pittsburgh, Pa., a corporation of Pennsylvania Application February 5, 1959, Serial No. 791,337

5 Claims. (Cl. 317—234)

This invention relates to asymmetrically conductive structures containing a silicon carbide monocrystalline member and in particular it concerns rectifying structures including such a member.

An object of the present invention is to provide a semiconductor structure which includes a monocrystalline silicon carbide member having a p–n junction and a solder cooperating therewith to bond metal and graphite electrodes to the surfaces thereof.

It is a further object of the present invention to provide semiconductive rectifier structures embodying silicon carbide members capable of operating at relatively high ambient temperatures.

Conduction occurs in electronic semiconductors by means of two types of charge carriers, electrons and holes. These carriers can be provided in the semiconductor by the presence therein of a significant conductivity impurity. Generally, those conductors wherein conduction is largely by electrons are called n-type while those where conduction occurs by holes are called p-type. Where it is desirable to identify the conductivity characteristics of the materials with greater particularity, n+ and p+ are used to identify regions which have a more marked predominance of the characteristic type of charge carrier. Significant conductivity impurities that characterize the semiconductor with n–type conduction are known as n–type impurities or donors, and those which result in p–type conductivity are known as p–type impurities or acceptors.

Silicon carbide single crystals are relatively stable electronically up to a temperature well beyond about 650° C. This, of course, presents remarkable possibilities for semiconductor applications as is apparent upon considering the fact that semiconductors of germanium and of silicon are limited to operation at temperatures not above about 100° C. and 200° C., respectively.

The utilization of silicon carbide single crystals for semiconductor applications recently has been facilitated by the discovery of convenient methods of preparing volume quantities of the crystals. One method is found in the article by Lely in Ber. der D. Keram. Ges. 32, pages 229 to 250 (1955). Other methods are disclosed in the copending application of Chang and Kroko, Serial No. 738,806 filed May 29, 1958. In those methods, the silicon carbide crystals grow from the vapor phase in the form of hexagonal platelets. The crystals can, if desired, be obtained with a particular and predetermined conductivity by maintaining a suitable doping agent in the vapor from which the crystal is grown.

While single crystals of silicon carbide of suitable conductivity can be made, their use in forming semiconductor structures is relatively complicated. For example, solders and encapsulations that find use in silicon and germanium devices cannot withstand temperatures beyond about 300° C. To employ such materials in conjunction with a silicon carbide wafer would, of course, limit the operating temperature of the resulting device and consequently would not be satisfactory.

Silicon carbide possesses a very low coefficient of thermal expansion. Consequently, solders attached thereto and which normally have a different expansion rate, will tend to strain the crystal. This property of silicon carbide also introduces the problem of differential expansion involving the silicon carbide crystal, a junction area thereon and the solders and electrodes which may be used conjointly therewith. Another difficulty involving solders is the problem of finding one that will wet both the silicon carbide and the material that is to function, for example, as an electrode.

In the present invention, these and other difficulties are overcome and a semiconductor rectifier including a silicon carbide single crystal is provided by using silicon, or silicon-germanium alloys to bond the silicon carbide wafer to a terminal of a metal or alloy such as tungsten or molybdenum. Silicon, as well as the alloys of silicon and germanium, are unique solders for this purpose since they will form a good bond to silicon carbide and to metal and graphite electrodes.

Accordingly, rectifier structures of this invention comprise a silicon carbide single crystal having an intermediate zone containing a p-n junction and metal electrodes soldered to the terminal zones contiguous to the junction with silicon, or a silicon-germanium alloy. Where it is desired to space the electrodes from the single crystal, wafers of graphite can be attached to the crystal with these solders and the metal electrodes are then bonded to the graphite. The graphite elements serve to physically separate the electrodes from the single crystal and to joint them, electrically, thereto. In this manner, suitable rectifiers have been devised without encountering the many problems and disadvantages heretofore thought to accompany the use of monocrystalline silicon carbide for this purpose.

The invention can be readily understood upon considering the description which follows in conjunction with the attached drawing which shows a longitudinal sectional view of a rectifier structure in accordance with the present invention.

The rectifier structure as shown in the drawing contains a first electrode 5 and a second electrode 6, located at the top and bottom, respectively, of the device. The electrodes serve as means to connect the device into the circuitry in which it is to be used and to provide electrical contact with the crystal. The electrodes shown are composed of molybdenum, but other materials may be used as long as they have coefficients of expansion in the range of silicon carbide. Typical examples are tungsten, tantalum and zirconium.

Adjacent the electrodes and electrically joined thereto are graphite discs 8 and 10. The primary function of the graphite discs is to serve to join the electrodes to the silicon carbide. The electrodes are joined to the graphite discs by a suitable solder such, for example, as a nickel-aluminum alloy and suitably an 85:15 nickel-aluminum alloy.

The remaining member of the structure is a monocrystalline silicon carbide member 12, suitably a hexagonal wafer several mils thick. Since the resultant structure functions as a rectifier, the single crystal used has a p-n junction. This can be provided by using a crystal that is grown in an atmosphere containing, in sequence, a p-type impurity and an n-type impurity, e.g. nitrogen and aluminum, respectively. The impurities dope layers in the crystal with the heaviest concentration of the n-type impurity being designated *n.

The silicon carbide is located between the graphite discs and is soldered to them using solders composed of silicon, or alloys of silicon and germanium, e.g. 50:50 Si-Ge. In the illustrated rectifier, silicon wafers 16 and 18 are shown to emphasize and illustrate the need for solder at those surfaces. The solder used generally is doped with an impurity of the same type impurity as is the conductivity determining impurity at that portion or surface of the silicon carbide crystal. The soldering step must be carefully controlled to avoid loss of the solder from the meeting surfaces by soaking into the graphite.

The structure shown is compact and can withstand physical shock. Of greater importance, however, is the fact that it can be utilized at high ambient temperature, i.e. 650° C. and above, without deleteriously affecting its utility. In this connection it may be noted that the elements present in addition to the monocrystalline silicon carbide place no temperature limitations on the device.

Where a rectifier in accordance with this invention is provided with graphite spacers, as just described, the preferred solder is silicon. When those spacers are omitted and the metal electrodes are joined to the silicon carbide crystal, alloys of silicon and germanium may be as suitable or better than the silicon alone. In either instance, the solder is applied in the usual manner, i.e., by melting and then solidifying it between the opposing surfaces of the crystal and wafer to be connected thereto.

A typical rectifier in accordance with this invention can be fabricated in the following manner. It should be understood that all materials used preferably are of the best purity available. A crystal of silicon carbide having a grown junction is first cleaned with a degreasing agent such as carbon tetrachloride and then is etched with a halide etchant. A typical size crystal that may be used is a disc ⅛ inch in diameter and 0.020 inch thick. Two pieces of molybdenum, to serve as electrodes, of approximately ⅛ inch diameter and 0.030 inch thick are cleaned with carbon tetrachloride.

Two discs of aluminum-nickel solder (85:15 Al-Ni) ⅛ inch diameter 0.003 inch thick are cleaned as well as two ⅛ inch diameter 0.002 inch thick pieces of silicon. Two graphite discs approximately ⅛ inch diameter 0.020 inch thick are also prepared in a manner avoiding excessive contamination.

Soldering is carried out in two steps. First the silicon carbide crystal is placed in a sandwich in the following order: graphite disc, silicon disc, silicon carbide disc, silicon disc and graphite disc as illustrated in the drawing. The assembly is then clamped in a graphite heating element and is heated at about 1600° C. in a vacuum to melt the silicon solder and held at this condition for about a minute to join the graphite to the silicon.

Next the soldered sandwich is removed and the aluminum-nickel solder discs are placed on the graphite surfaces and finally the molybdenum discs are added and the entire assembly as shown in the drawing is heated in a vacuum to fuse the molybdenum contacts to the graphite. The resulting structure is the completed basic rectifier assembly.

Tests were conducted on the resulting silicon carbide rectifier assembly at various elevated temperatures. The inverse leakage did not exceed two milliamperes up to 500° C. for voltages of up to 150 volts PIV (peak inverse voltage). At 500° C. the forward drop was 10 volts at 0.5 amperes. When tested at 600° C. the inverse leakage was 2.5 milliamperes at 100 volts PIV, and 5 milliamperes at 150 volts PIV. At 700° C., the tests indicated an inverse leakage of 9 milliamperes at 50 volts PIV, and 19 milliamperes at 100 volts PIV. Accordingly, the resulting structure can be used to rectify current in place of the presently available silicon and germanium single crystal rectifiers, but with the advantages of higher operating temperature. The other characteristics of the crystal, such as the resistivity, Hall coefficient and the band gap, also demonstrate the advantages of this structure.

In accordance with the provisions of the patent statutes, the principle of this invention has been stated and the invention illustrated and described with what is now believed to be its best embodiment. However, it should be understood that the invention may be practiced otherwise than as specifically described and illustrated.

I claim as my invention:

1. A semiconductor rectifier structure comprising a monocrystalline silicon carbide wafer having an intermediate zone containing a p-n junction, a first terminal zone contiguous with one side of the intermediate zone in which a donor impurity is the predominant significant impurity, a second terminal zone contiguous with the opposite side of the intermediate zone in which an acceptor impurity is the predominant significant impurity, and a metal electrode soldered to each of said terminal zones of said silicon carbide wafer, the solder composed of a metalloid from the group consisting of silicon, and silicon-germanium alloys.

2. The rectifier structure of claim 1, wherein the electrodes are of a metal selected from the group consisting of molybdenum, tungsten, tantalum and zirconium.

3. A semiconductor rectifier structure comprising, in consecutive arrangement, a first electrode, a graphite wafer, a p-n junction-containing monocrystalline silicon carbide wafer having terminal zones of different conductivity types, a second graphite wafer and a second electrode, said electrodes being electrically joined to said graphite discs adjacent thereto and said graphite discs being in low resistance contact with said silicon carbide.

4. A rectifier structure in accordance with claim 3 in which said electrodes are of a metal selected from the group consisting of molybdenum, tungsten, tantalum and zirconium.

5. A semiconductor rectifier structure comprising a monocrystalline silicon carbide wafer having an intermediate zone containing a p-n junction, a first terminal zone contiguous with one side of said intermediate zone in which a donor impurity is the predominant significant impurity, a second terminal zone contiuous with the opposite side of said intermediate zone in which an acceptor impurity is the predominant significant impurity, a graphite disc on each of said terminal zones joined electrically with said silicon carbide wafer with a solder selected from the group consisting of silicon, and alloys of silicon and germanium, and an electrode soldered to each of said graphite discs.

References Cited in the file of this patent

UNITED STATES PATENTS 2,273,704 Grisdale ---------------- Feb. 17, 1942